United States Patent [19]

Theimer

[11] 4,449,814
[45] May 22, 1984

[54] EXPOSURE DEVICE

[76] Inventor: Siegfried Theimer, Rohler Strasse 12, D-6484 Obersotzbach, Fed. Rep. of Germany

[21] Appl. No.: 466,334
[22] PCT Filed: Jun. 2, 1982
[86] PCT No.: PCT/DE82/00118
§ 371 Date: Feb. 4, 1983
§ 102(e) Date: Feb. 4, 1983
[87] PCT Pub. No.: WO82/04333
PCT Pub. Date: Dec. 9, 1982

[30] Foreign Application Priority Data

Jun. 6, 1981 [DE] Fed. Rep. of Germany ....... 3122707

[51] Int. Cl.³ .............................................. G03B 27/04
[52] U.S. Cl. ........................................ 355/85; 271/226
[58] Field of Search ....................... 355/87, 85, 91, 92, 355/99, 113, 118

[56] References Cited

U.S. PATENT DOCUMENTS 3,420,608 1/1969 Canale .................................. 355/91
4,204,736 5/1980 Hamada et al. ...................... 355/118

FOREIGN PATENT DOCUMENTS 3014840 10/1980 Fed. Rep. of Germany ........ 355/85
2476335 8/1981 France .

Primary Examiner—L. T. Hix
Assistant Examiner—Brian W. Brown
Attorney, Agent, or Firm—Schwartz, Jeffery, Schwaab, Mack, Blumenthal & Koch

[57] ABSTRACT

The invention relates to an exposure device for reprographic techniques to expose photosensitive materials through a master in which the copy partners are pressed by a rubber mat against a glass plate and the exposure is effected through the glass plate.

To improve the complete contact of the copy partners with each other and with the glass plate, a smoothing device (6) is provided on the rear surface of the rubber mat, consisting of pressure elements, in particular rollers (12), drawn on chains (7) over the rear surface of the rubber mat. The pressure elements squeeze out potential air pockets between the rubber mat and the glass plate and insure that the copy partners fit tightly against each other without separation over their entire surface.

11 Claims, 2 Drawing Figures

EXPOSURE DEVICE

BACKGROUND OF THE INVENTION

1. Field of the Invention

The present invention relates to an exposure device for the reprographic industry, as is used for the exposure of a photosensitive material through a master. The photosensitive material is usually a film, an offset printing plate or a photopolymer printing plate, and the master is usually a film. The photosensitive material and the master together represent the copy partners.

2. Discussion of the Related Art

In the exposure of such photosensitive materials through a master, the quality of the resulting copy decisively depends on the close, completely flush fit of the copy partners against each other. In order to assure this, special measures are typically taken to reliably press the photosensitive material over its entire surface against the master.

Most frequently, a flexible mat, in particular a rubber mat, is used for this purpose, which after the insertion therebetween of the copy partners, can be pressed together with a glass plate through which the exposure is effected. During the pressing together of the rubber mat and the glass plate, sealing contact is established with a sealing bead bordering the mat. In the mat, at least one orifice connectable with a source of negative pressure is provided, and following the generation of negative pressure in the space between the glass plate, the mat and the copy partner (master and photosensitive material) inserted inbetween are suctioned against the glass plate and/or pressed against the glass plate by the higher atmospheric pressure acting on the other surface of the mat.

A constantly recurring problem is the prevention of so-called hollow copies. These are copies with blurred areas resulting from the fact that, in spite of the efforts to establish intimate contact over the entire surface between the copy partners, there still are present locations in which a separation remains between the master and the photosensitive material. In these areas, due to the scattered light, fine lines and half-tone dots as well as with the trueness of the copy are lost.

Numerous attempts have been made to remedy this defect.

Among others, the suctioning is repeated, whereby initially a prevacuum of approximately 40% of the full vacuum (the vacuum obtained with the given source of negative pressure) is applied for approximately 2 minutes and then released, with the idea that the copy partners will now again align and flatten themselves against each other, whereupon the final, full vacuum is applied and a waiting period of a few minutes is observed prior to the exposure. In spite of the considerable time expenditure inherent in this process, the results are not always satisfactory.

It frequently occurs that the rubber mat is already suctioned tightly at the onset of the introduction of the negative pressure against the glass plate in its border areas and then potentially present bulges can no longer be eliminated. If the border areas of the rubber mat adhere tightly against the glass plate, islands of air can no longer be eliminated, even by increasing the negative pressure.

Attempts have been made to establish tight contact of the rubber mat with the glass plate by mechanical action against the rear side of the mat. Thus, for example, according to one proposal in an exposure device having a stationary rubber mat which is positioned on the bottom and upon which the copy partners are placed whereupon the pivoting glass plate is lowered, the rubber mat is supported by sheet metal which is convexly bowed in the upward direction. This functions so that, during the lowering of the glass plate, initially the center of the mat and of the copy partners is pressed against the glass plate, and the pressure zone expands outwardly toward the edges. The idea here is that, in this manner, no air pockets can remain trapped between the master and the photosensitive material, but instead they are pressed out in the outward direction. However, this measure again does not provide the desired success.

Another proposal made in DE-OS 27 19 716 resides in additionally introducing a transparent bag to be filled with a pressure medium between the glass plate and the copy master, which upon pressurization is to assure full contact of the copy partners. This proposal has yet to prove itself, but in any case, it involves a not insubstantial complication of the construction and operation of the copying frame.

Finally, it is known to bring the copy partners into full contact with each other by means of electrostatic forces. In commercial literature of the Simco Company of Landsdale, Pennsylvania, U.S.A., an electrostatic copying frame is described, in which the copy partners are merely placed onto an electrostatically charged surface and smoothed manually by means of a roller rotated with a handle. There is no rubber mat or glass plate, and no negative pressure is used. This entirely different process again does not yield the results desired, and is not entirely without danger for the operator.

SUMMARY OF THE INVENTION

It is the object of the present invention to provide an exposure device in which, within the shortest period of time, a reliable, complete contact of the copy partners over their entire surface with each other and with the glass plate can be achieved.

To attain this object, it is proposed according to the invention to arrange on the rear side of the rubber mat at least one movable pressure element touching said rubber mat along a line transverse to its extent and capable of being driven in the longitudinal direction.

The pressure element may have the configuration of a wiper or a narrow brush but preferably of a roller equipped with a soft rubber surface.

By means of the invention, there is realized for the first time, in the case of copy partners placed between a glass plate and a rubber mat, a sliding pressure acting upon the rear side of the rubber mat in a manner of a flattening, simulating approximately the flattening of paper with the edge of one's hand. In this fashion, a copy quality substantially exceeding previous efforts is obtained.

While in the afore-described flat rolling of the copy partners realized in connection with the electrostatic copying frame the purpose is merely to achieve their intimate contact with the electrostatically charged surface of the copying frame in order to render the electrostatic attraction forces effective, in the exposure device according to the invention, a mechanical squeezing out of air pockets is achieved in connection with the copy partners which are already present between a rubber mat and a glass plate, even when surfaces involved are slightly adherent. In this way, high voltages which are dangerous under certain conditions can be completely eliminated, and also the use of negative pressure is either unnecessary or it can be used with a slight vacuum, which has the advantage in the case of sensitive films that pressure points are not reproduced, which, e.g., are caused by the structured rubber surface.

Advantageously, there is used for the longitudinal displacement of the pressure element a chain drive of two endless chains which run within a frame adjacent to its longitudinal end pieces around driving and reversing sprockets; the pressure element extends between the chains which the returning strands of the chains are supported over their entire length by a single guide rail or one guide rail for each chain, in order to absorb the reaction force of the pressure element.

In order to achieve an approximately constant contact pressure of the pressure element during its passage through the work section, the guide rails may advantageously be constructed in the form of flexible strips and at short intervals forced by springs or the like in the direction of the rubber mat; or each guide rail may consist of a plurality of successive sections, each of which individually presses the working chain strand against the rubber mat; or the pressure element may be supported in the chains so as to be spring biased outwardly.

It is furthermore convenient to arrange several pressure rollers at uniform intervals on the chain drives, so that in operation a plurality of linear pressure surfaces run over the rear surface of the rubber mat, which improves the smoothing action.

If, however, the distance between the pressure rollers is too short, it may be that they mutually interfere with each other's action in that an air pocket moved along in front of one pressure roller is prevented from escaping by the roller running ahead of it. It is therefore appropriate to arrange between each pair of adjacent rollers at least one shaft upon which pressure disks are mounted at intervals. This disk shaft then produces only continuous pressure points or an interrupted pressure line, so that air inclusions may escape between contact points.

When several disk shafts are arranged between adjacent pressure rollers, it is appropriate to arrange their disks offset in the transverse direction with respect to each other.

Potentially, the squeezing out of possible air inclusions should be performed several times in the same direction. If this has been effected, it may, however, be advantageous to reverse the drive motor of the chain drives and run the flattening device in the opposite direction. Potentially still existing adhesions between the surfaces involved can under certain conditions be released better in this manner.

The invention is applicable both to exposure devices with illumination in the upward direction and to those with illumination from above.

In exposure devices with upward illumination, the lamp producing the light beam in the upward direction is located in a housing stand, the upper cover of which represents the stationary glass plate; in this case the rubber mat together with the entire flattening assembly which functions on it consisting of the motor, chain drives and pressure rollers, is conveniently arranged in a frame, which is hingedly connected to the housing stand so as to be pivotable up and down.

In the case of exposure devices with illumination from above, the rubber mat is stationarily mounted, and the glass plate is hingedly connected to the housing so as to be pivotable up and down. In this case, the flattening device is conveniently arranged under the rubber mat in the housing.

Finally, it is advantageous to effect in the known manner a negative pressure in the space between the rubber mat and the glass plate, for which the rubber mat is equipped with a sealing bead extending along its edge and has a connection for the introduction of the vacuum. Advantageously, in this arrangement there is used a control program in a manner so that the mechanical flattening takes place during or after an initially weaker prevacuum is drawn after which the flattening device is deactivated and the final vacuum is drawn.

The invention will be explained in more detail hereinafter by means of the description of an exemplary embodiment, with the aid of the drawings attached hereto. In the drawings.

DETAILED DESCRIPTION OF PREFERRED EMBODIMENTS

Figure 1:
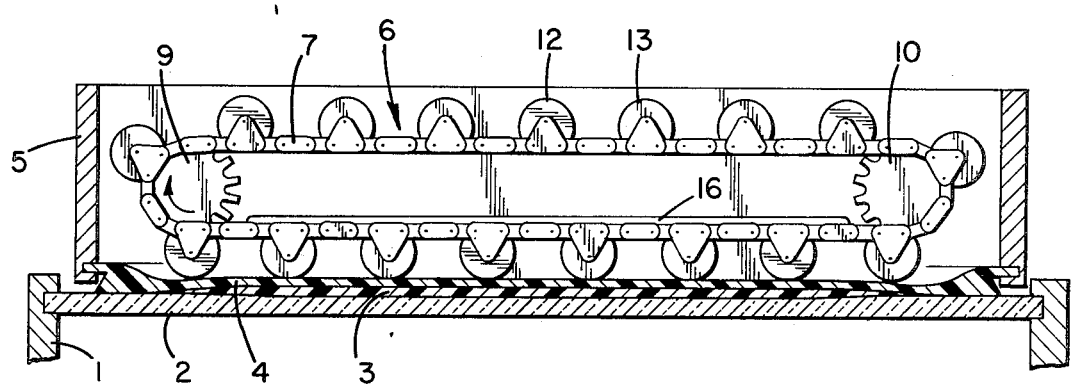
FIG. 1 shows schematically a cross-sectional view of the exposure device along the section line I—I in FIG. 2.

The embodiment of the exposure device presented as an example represents a device with illumination from above, in which a lamp (not shown) is located in a housing stand 1 and projects a beam of light upwardly through a glass plate 2, upon which the copy partners are to be placed, i.e., first the copy master and then the photosensitive material.

In order to produce tight pressing of the copy partners against each other and against the glass plate, a rubber mat 4 may be lowered onto the glass plate, with the mat 4 being tautly mounted in a frame 5 which is pivotally hinged to the housing stand 1. The rubber mat 4 has a conventional sealing lip extending around its edge and at least one orifice in a corner, which may be connected with a source of negative pressure in order to evacuate the space between the glass plate and the rubber mat.

On the rear side of the rubber mat 4 facing away from the glass plate 2, in the frame 5, a flattening assembly designated in its entirety by 6 is installed. The latter consists of a chain drive having two endless chains 7, each of which runs closely adjacent to a longitudinal end piece 8 of the frame 5, thereby each passing around a driving sprocket 9 and a reversing sprocket 10 each. The driving sprockets 9 are mounted on a drive shaft 11, which is rotated by a motor 20, and each reversing sprocket 10 is mounted on an axle journal 21.

At uniform intervals chain links are provided, as seen in FIG. 1, so that an axle journal may be rotatingly located in them. In this manner, rollers 12 which possess a rubber surface extend transversely between the chains and are supported thereby as well as disk shafts 13 which consist of an axle 14 and circular disks 15 which are mounted on the axle at intervals. In operation, the pressure rollers 12 produce a contact line progressing along the rubber mat 4, and the disk shafts, in a similar manner, produce a plurality of moving contact points or contact line segments.

In the illustrated embodiment, two disk shafts 13 are arranged between two adjacent pressure rollers 12, with the disks 15 of the shafts being offset in the transverse direction with respect to each other.

Figure 2:
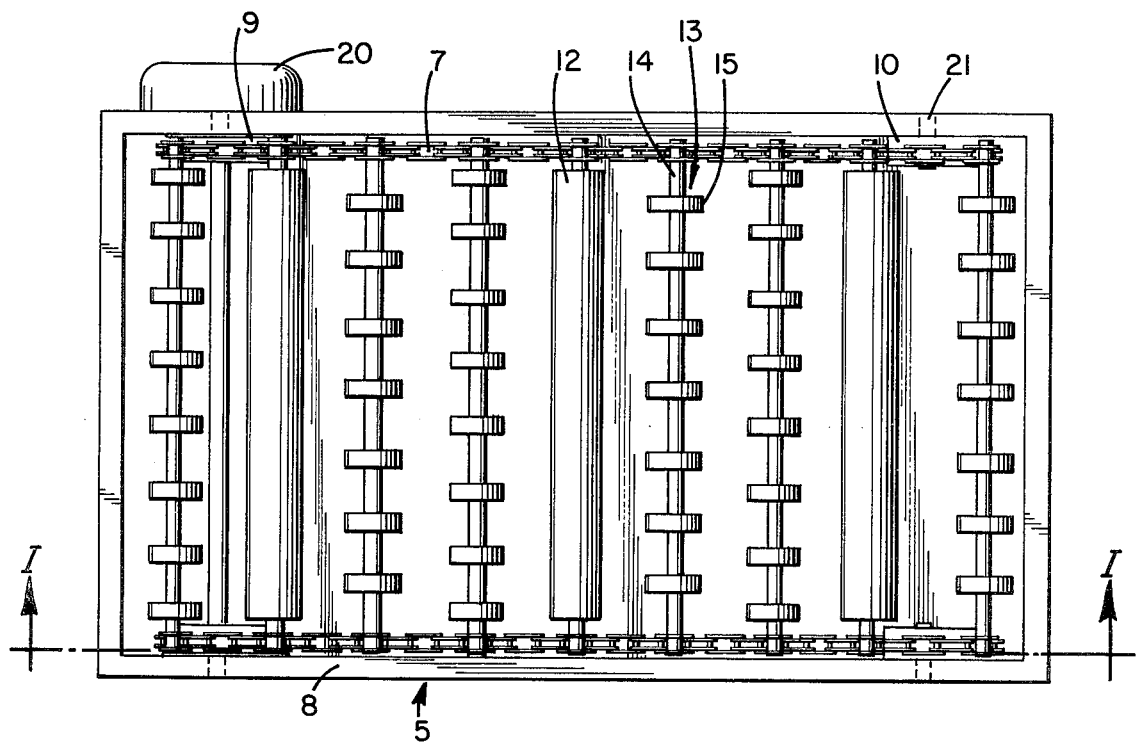
FIG. 2 is a top view of the exposure device.

In order to insure the pressing of the pressure elements 12 and 13 over the entire extent along the rubber mat 4, pressure guide rails 16 (not shown in FIG. 2 for the sake of clarity) are provided, which press each of the lower returning chain strands downwardly in the direction of the rubber mat 4.

In order to be able to equalize on the rear surface of the rubber mat the differences in height existing at the edge of the copy partners or different thicknesses even within the area of the copy partners, e.g., in the case of pasteups, each pressure rail is elastic and readily flexible, and it is made certain by appropriate means that each pressure rail presses over its entire length against the lower chain strand with an approximately equal force per unit length. This may be insured, for example, by means of compression springs succeeding each other at short intervals and acting on the pressure rail from above, or by each of the pressure rails being divided into short, downwardly resilient segments, or else, by the pressure elements being supported resiliently in the chains.

Operation with the above-described exposure device is effected as follows:

The copy partners 3 are placed onto the glass plate 2, and the frame 5 is pivoted downwardly and locked in its lowered position. The flattening device 6 is then set in operation in a manner such that the motor 20 is switched on; a prevacuum may be drawn simultaneously.

In this operating phase, the pressure elements 12 and 13 roll over the rear surface of the rubber mat and smooth it mechanically flat while pressing it against the glass plate, whereby potentially existing air inclusions are squeezed out in the longitudinal direction. The disk shafts 13 preceding the pressure rollers 12 prepare the pressing action in uninterrupted contact lines by means of the pressure rollers 12, without preventing existing air pockets from also being squeezed out in the forward direction.

In case the surfaces of the mat and the copy surfaces are slightly adherent, it may be convenient to reverse the motor 20 after a certain period of time, so that the smoothing action takes place in the opposite direction. It is to be understood that all of this may be effected automatically, for example, by program control of the motor, just as the actuation of the motor may be effected by the lowering of the frame 5.

When all existing air inclusions are reliably eliminated, the flattening device 6 is stopped, and the negative pressure between the rubber mat and the glass plate is raised to its full vacuum value. This is followed by the exposure to light.

The foregoing is based on a conventional, elongated frame 5, in which the chains 7 appropriately run parallel to the longitudinal edges 8. If the frame has a square configuration, the direction in which the smoothing action takes place is immaterial.

It is similarly to be understood that the fundamental concept of the invention is not altered if, in place of an exposure device with an upwardly directed illumination, a device is used in which the rubber mat is stationary and represents the upper surface of a housing stand, and the glass plate can be lowered onto the rubber mat, with the lamp then being arranged above and the glass plate illuminated from above. In this case, the flattening device may be arranged in the housing stand under the mat.

Finally, it should be understood that technical equivalents may be employed for individual elements, for example, the plate 2 may consist of another transparent or translucent material instead of glass and the mat 4 may be made of another flexible material instead of rubber.

I claim:

1. An exposure device for the exposure of photosensitive material through a master, comprising a glass plate; a rubber mat having a front side and a rear side and being arranged to be pressed against said glass plate; means for applying negative pressure between said glass plate and said front side of said rubber mat whereby said photosensitive material and said master may be inserted between the glass plate and the front side of said rubber mat and an exposure may be effected through said glass plate, said device further comprising a pressure roll; and means for rolling said pressure roll over the rear side of said rubber mat for smoothing said rubber mat, said rolling means comprising a drive with two endless drive members mounted over the rear side of said rubber mat with said pressure roll extending between and being carried by said endless drive members.

2. An exposure device according to claim 1, further comprising a frame having two longitudinal sides, said rubber mat being mounted to said frame and said two endless drive members running parallel to said longitudinal sides, said pressure roll extending in the transverse direction between said longitudinal sides, and pressure rails positioned to force at least a portion of said endless drive members toward said rubber mat.

3. An exposure device according to claim 2, further comprising an axle mounting said pressure roll, said axle being supported in said endless drive members.

4. An exposure device according to claim 2, wherein each pressure rail comprises a flexible strip and springs mounted to force said flexible strip in the direction of the rubber mat.

5. An exposure device according to claim 1, wherein the pressure roll includes a surface having a soft layer of rubber.

6. An exposure device according to claim 1, wherein a plurality of additional pressure rolls are mounted to said endless drive members and between each two adjacent pressure rolls at least one shaft is arranged, upon which pressure disks are mounted in a spaced apart manner.

7. An exposure device according to claim 6, wherein at least two disk shafts are arranged between two adjacent pressure rolls, the disks whereof are offset in the transverse direction with respect to each other.

8. An exposure device according to claim 1, further comprising a reversible drive motor connected to said endless drive members.

9. An exposure device according to claim 2, wherein said glass plate is held stationary in a housing stand and said frame carrying said rubber mat and said pressure roll is pivotally connected to said housing stand.

10. An exposure device according to claim 1, wherein said rubber mat is held stationary in a housing stand and said pressure roll is arranged under said rubber mat, said glass plate being articulated so that it may be pivoted down onto the rubber mat, with the exposure being effected from above.

11. An exposure device according to claim 1, further including a programmed control for controlling operation of the device so that following the compression of the rubber mat and the glass plate against each other, a prevacuum is established, and the pressure roll is actuated and a full vacuum drawn.

* * * * *